(12) United States Patent
Zhang

(10) Patent No.: US 11,367,860 B2
(45) Date of Patent: Jun. 21, 2022

(54) BONDING DEVICES AND BONDING METHODS FOR IRREGULAR-SHAPED CURVED COVER PLATES AND FLEXIBLE SCREENS

(71) Applicant: Yungu (Gu'an) Technology Co., Ltd., Langfang (CN)

(72) Inventor: Xiaolong Zhang, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 352 days.

(21) Appl. No.: 16/735,727

(22) Filed: Jan. 7, 2020

(65) Prior Publication Data
US 2020/0144559 A1 May 7, 2020

Related U.S. Application Data

(63) Continuation of application No. PCT/CN2018/111278, filed on Oct. 22, 2018.

(30) Foreign Application Priority Data

Apr. 20, 2018 (CN) .......................... 20180360430.2

(51) Int. Cl.
*H01L 51/56* (2006.01)
*B32B 37/10* (2006.01)
(Continued)

(52) U.S. Cl.
CPC .......... *H01L 51/56* (2013.01); *B32B 37/0046* (2013.01); *B32B 37/1009* (2013.01);
(Continued)

(58) Field of Classification Search
CPC .......... B32B 38/1866; B32B 2037/109; B29C 66/836; B29C 66/81459; B29C 66/81423; B29C 66/61; Y10T 156/1028
(Continued)

(56) References Cited

U.S. PATENT DOCUMENTS

| 10,418,570 | B2 | 9/2019 | Wang |
| 11,251,395 | B2* | 2/2022 | Sim .......................... B32B 9/041 |
| 2012/0111479 | A1 | 5/2012 | Sung et al. |
| 2014/0138009 | A1* | 5/2014 | Lim ........................ H01L 51/56 |
| | | | 156/60 |

(Continued)

FOREIGN PATENT DOCUMENTS

| CN | 204009275 U | 12/2014 |
| CN | 104317080 A | 1/2015 |

(Continued)

OTHER PUBLICATIONS

Extended European Search Report dated Jan. 27, 2021 in corresponding EP Application No. 18915359.

(Continued)

*Primary Examiner* — Scott W Dodds
(74) *Attorney, Agent, or Firm* — Kilpatrick Townsend & Stockton

(57) ABSTRACT

A bonding device and a bonding method for an irregular-shaped curved cover plate and a flexible screen are disclosed. The bonding device includes: a support body supporting the flexible screen; and a bonding body supporting the flexible screen together with the support body and pressing the flexible screen. The bonding body has a cylindrical shape. A cross-sectional shape of the bonding body along an axial direction matches with a cross-sectional shape of the irregular-shaped curved cover plate. The support body is located at a radial end of the bonding body. The bonding body can be expanded along the axial direction, to have opposite sides thereof abutted against the arc hook areas.

10 Claims, 9 Drawing Sheets

(51) Int. Cl.
   *H01L 51/52* (2006.01)
   *B32B 38/18* (2006.01)
   *B32B 37/00* (2006.01)

(52) U.S. Cl.
   CPC ...... *B32B 38/1866* (2013.01); *H01L 51/5246* (2013.01); *B32B 37/003* (2013.01); *B32B 2037/109* (2013.01); *B32B 2457/20* (2013.01); *H01L 2251/5338* (2013.01); *Y10T 156/1028* (2015.01)

(58) Field of Classification Search
   USPC ........................................ 156/212, 293, 523
   See application file for complete search history.

(56) References Cited

U.S. PATENT DOCUMENTS

| | | | |
|---|---|---|---|
| 2014/0262008 A1* | 9/2014 | Balaji | B29C 63/0004 |
| | | | 156/60 |
| 2016/0081204 A1 | 3/2016 | Park et al. | |
| 2016/0202728 A1 | 7/2016 | Kim | |
| 2017/0263492 A1* | 9/2017 | Son | H01L 27/1262 |
| 2018/0086034 A1 | 3/2018 | Lee et al. | |
| 2019/0165331 A1 | 5/2019 | Shang | |
| 2019/0315111 A1* | 10/2019 | Chen | G06F 1/1652 |

FOREIGN PATENT DOCUMENTS

| | | |
|---|---|---|
| CN | 104471630 A | 3/2015 |
| CN | 204622748 U | 9/2015 |
| CN | 204622754 U | 9/2015 |
| CN | 105118391 A | 12/2015 |
| CN | 105128409 A | 12/2015 |
| CN | 105930011 A | 9/2016 |
| CN | 106154675 A | 11/2016 |
| CN | 106564268 A | 4/2017 |
| CN | 106920830 A | 7/2017 |
| CN | 107016936 A | 8/2017 |
| CN | 107020785 A | 8/2017 |
| CN | 107379567 A | 11/2017 |
| CN | 107591428 A | 1/2018 |
| CN | 107688403 A | 2/2018 |
| CN | 206954599 U | 2/2018 |
| CN | 107863005 A | 3/2018 |
| CN | 107886849 A | 4/2018 |
| JP | 2015039862 A | 3/2015 |
| JP | 2016203609 A | 12/2016 |
| KR | 20070101735 A | 10/2007 |
| KR | 101468973 B1 | 12/2014 |
| KR | 20160102767 A | 8/2016 |
| KR | 101706617 B1 | 2/2017 |
| KR | 101737355 B1 | 5/2017 |
| KR | 20170106552 A | 9/2017 |
| TW | 201805174 A | 2/2018 |
| TW | 201806890 A | 3/2018 |
| WO | 2014021192 A1 | 2/2014 |
| WO | 2017138569 A1 | 8/2017 |

OTHER PUBLICATIONS

Japanese Office Action dated Jun. 28, 2021 in corresponding JP Application No. 2020-536180.
Office Action of CN Patent Application No. 202010455459.6.
CN First Office Action with search report dated Jul. 12, 2019 in the corresponding CN application (application No. 201810360430.2).
International Search Report dated Jan. 28, 2019 in the corresponding PCT application (application No. PCT/CN2018/111278).
Notice of Allowance of JP Patent Application No. 2020-536180.
Notice of Allowance of KR Patent Application No. 10-2019-7021435.

* cited by examiner

BONDING DEVICES AND BONDING METHODS FOR IRREGULAR-SHAPED CURVED COVER PLATES AND FLEXIBLE SCREENS

CROSS-REFERENCES TO RELATED APPLICATIONS

The present application is a continuation of International Application No. PCT/CN2018/111278 filed on Oct. 22, 2018, which claims priority to Chinese patent application No. 2018103604302, filed on Apr. 20, 2018. Both applications are incorporated herein by reference in their entireties.

TECHNICAL FIELD

The present disclosure relates to flexible screen bonding technology.

BACKGROUND

The flexible screen is a new growth point of the future industry, and the characteristic of flexibility of the flexible screen is continuously exploited and utilized. For example, by attaching the flexible screen to a 3D fixed curved cover plate (both sides of the cover plate are a quarter of arc), the display of the front and sides of the product can be realized. Unfortunately, conventional techniques have been inadequate.

SUMMARY

Accordingly, it is desirable to provide a new bonding device and a bonding method.

A bonding device, adapted for attaching an irregular-shaped curved cover plate to a flexible screen, the irregular-shaped curved cover plate includes a flat area and a pair of arc hook areas located on opposite sides of the flat area and extending from the flat area;
the bonding device includes: a support body supporting the flexible screen; and a bonding body supporting the flexible screen together with the support body, and pressing the flexible screen, the bonding body having a cylindrical shape, two ends of the bonding body respectively corresponding to the arc hook areas of the irregular-shaped curved cover plate, a cross-sectional shape of the bonding body along an axial direction matching with a cross-sectional shape of the irregular-shaped curved cover plate, the support body is located at a radial end of the bonding body;
the bonding body is capable of expanding along the axial direction, to have opposite sides thereof abutted against the arc hook areas.

In one of the embodiments, the bonding body includes two bonding half cylinders disposed axially symmetrically. Each of the bonding half cylinders includes a skeleton layer, and an elastic pressing layer wrapped outside the skeleton layer. The skeleton layer and the elastic pressing layer has an inflatable gas film cavity formed therebetween.

In one of the embodiments, the bonding device further includes:
a connecting rod extending through an interior of the two bonding half cylinders along an axial direction, an interior of the connecting rod having a first air passage in communication with the gas film cavity; and
a driving rod vertically connected to the connecting rod, an interior of the driving rod having a second air passage in communication with the first air passage.

In one of the embodiments, the bonding device further includes a gas source inflating the gas film cavity of the bonding body, and the gas source is connected to the driving rod.

In one of the embodiments, the gas source is a telescopic cylinder;
In one of the embodiments, the telescopic cylinder is fixed to a top of one end of the support body adjacent to the bonding body.

In one of the embodiments, the bonding half cylinder further includes a bonding half cylinder bearing located in the skeleton layer, and the bonding half cylinder bearing is sleeved on an outer side of the connecting rod and abuts against an inner wall of the skeleton layer.

In one of the embodiments, the bonding device further includes a driving device connected to the support body and driving the support body to move along a direction perpendicular to the axial direction of the bonding body.

In one of the embodiments, the elastic pressing layer is a silica gel layer.

In one of the embodiments, the bonding device further includes a cover plate positioning fixture positioning the irregular-shaped curved cover plate.

In addition, a method of bonding an irregular-shaped curved cover plate to a flexible screen is further provided, which includes:
providing a flexible screen, an irregular-shaped curved cover plate, and a bonding device for attaching the irregular-shaped curved cover plate to the flexible screen; the irregular-shaped curved cover plate comprises a flat area and a pair of arc hook areas located on opposite sides of the flat area and extending from the flat area;
attaching the flexible screen to an outer side of the support body and the bonding body to obtain an initial body;
moving the initial body into the irregular-shaped curved cover plate, and then expanding the bonding body along an axial direction until one end of the flexible screen is attached to the irregular-shaped curved cover plate; and
moving the support body along a radial direction of the bonding body, so as to drive the bonding body to press the flexible screen until the bonding of the irregular-shaped curved cover plate to the flexible screen is completed.

In one of the embodiments, the bonding body includes two bonding half cylinders disposed axially symmetrically. Each of the bonding half cylinders includes a skeleton layer, and an elastic pressing layer wrapped outside the skeleton layer. The skeleton layer and the elastic pressing layer has an inflatable gas film cavity formed therebetween.

Expanding the bonding body along the axial direction includes: filling gas into the gas film cavity to expand the bonding half cylinder along the axial direction.

In one of the embodiments, moving the initial body into the irregular-shaped curved cover plate includes: translating the initial body from an end of the irregular-shaped curved cover plate into the irregular-shaped curved cover plate.

In one of the embodiments, the attaching the flexible screen to the outer side of the support body and the bonding body includes: wrapping and adsorbing a portion of the flexible screen to the outer side of the support body by vacuum adsorption.

In the bonding device applied with the technical solution according to the present disclosure, the bonding body supports the flexible screen together with the support body, and after the bonding body expands along an axial direction, opposite sides of the bonding body can abut against the arc hook areas to complete the end bonding. Afterwards, when the support body moves along the radial direction of the bonding body, the bonding body is driven to move to press the flexible screen, thereby further improving the bonding effect.

In the method of bonding the irregular-shaped curved cover plate to the flexible screen applied with the technical solution according to the present disclosure, both ends of the flexible screen are prevented from interfering with both ends of the irregular-shaped curved cover plate by entering from the end of the irregular-shaped curved cover plate. In addition, after the bonding body expands along the axial direction, opposite sides of the bonding body can abut against the arc hook areas to complete the end bonding. Afterwards, when the support body moves along the radial direction of the bonding body, the bonding body is driven to move to press the flexible screen, thereby further improving the bonding effect.

DETAILED DESCRIPTION OF THE INVENTION

At present, a conventional bonding method of the flexible screen is to press the flexible onto the inner side of a glass cover plate via a silicon pad. However, a conventional bonding device can only perform bonding to the 3D fixed curved cover plate, when the cover plate is designed to be bent inwardly, that is, when the cover plate has an irregular shape, the bonding cannot be implemented by the conventional bonding device.

The above objects, features and advantages of the present disclosure will become more apparent by describing in detail embodiments thereof with reference to the accompanying drawings. Numerous specific details are set forth in the description below in order to provide a thorough understanding of the disclosure. However, the present disclosure can be implemented in many other ways than those described herein, and those skilled in the art can make similar modifications without departing from the scope of the present disclosure, and thus the present disclosure is not limited by the specific embodiments disclosed below.

Figure 1:
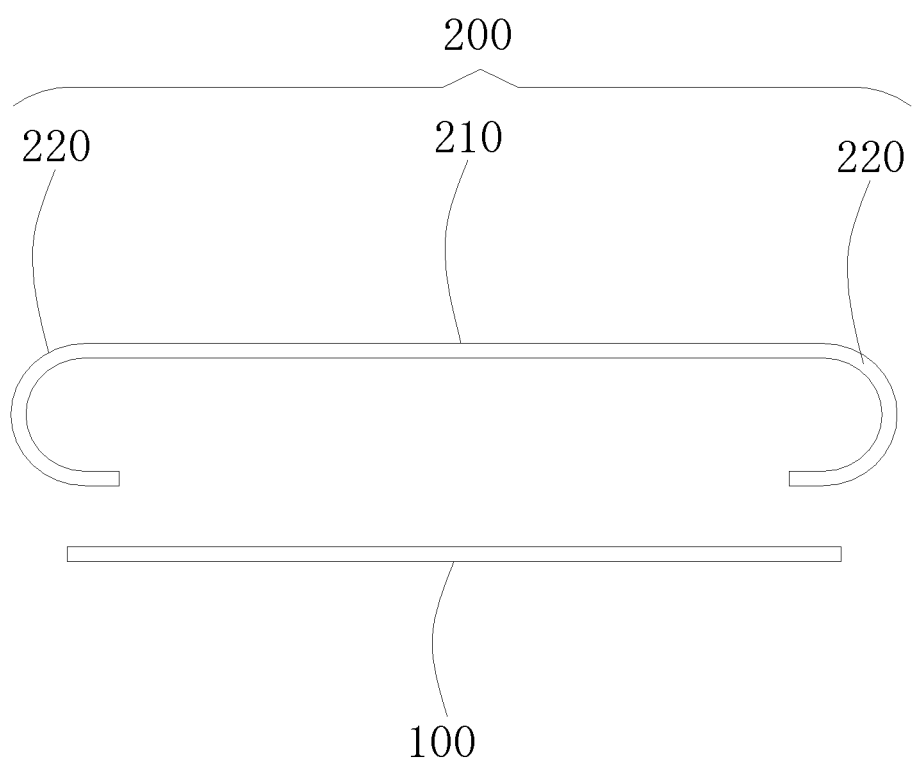
FIG. 1 is a schematic view of a flexible screen and an irregular-shaped curved cover plate.

Referring to FIG. 1, a flexible screen 100 and an irregular-shaped curved cover plate 200 are provided. The flexible screen 100 is preferably an Organic Light-Emitting Diode (OLED) flexible screen. The flexible screen 100 can also be other screens that are flexible and bendable.

The irregular-shaped curved cover plate 200 includes a flat area 210, and a pair of arc hook areas 220 located on opposite sides of the flat area 210 and extending from the flat area 210.

The flat area 210 is located at a center position of the irregular-shaped curved cover plate 200, and refers to a relatively flat area on the irregular-shaped curved cover plate 200. The arc hook area 220 is located at both ends of the irregular-shaped curved cover plate 200, and refers to an area formed by bending opposite sides of the flat area 210 inwardly, respectively. The arc hook areas 220 located on opposite sides of the flat area 210 are symmetrically disposed. Preferably, the arc hook area 220 has a shape of semi-circular that is tangential to the flat area 210.

Figure 2:
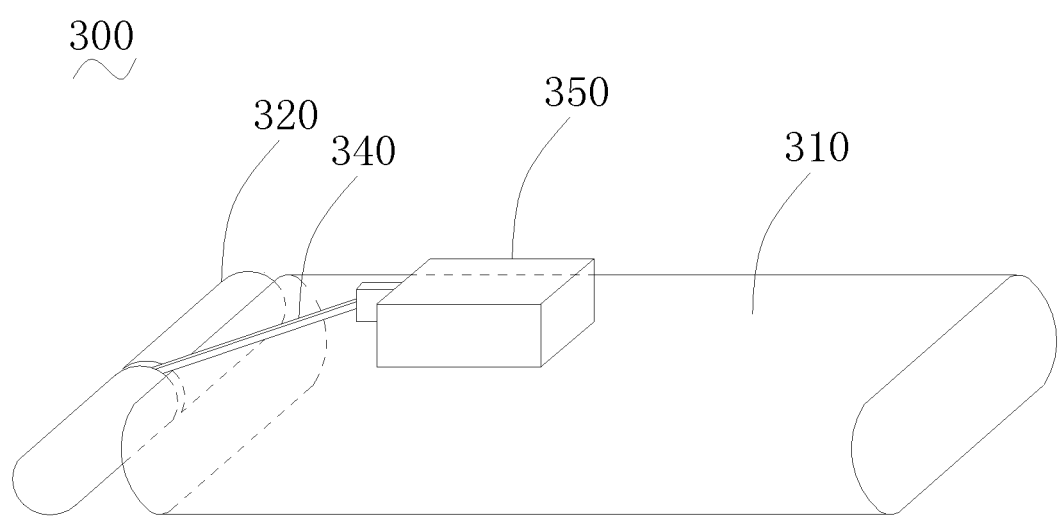
FIG. 2 is a schematic view of a bonding device according to an embodiment of the present disclosure.

Referring to FIG. 2, a bonding device 300 adapted for attaching an irregular-shaped curved cover plate to a flexible screen according to an embodiment of the present disclosure includes a support body 310 and a bonding body 320.

The support body 310 is used to support the flexible screen 100, and the support body 310 can be received in an inner side of the irregular-shaped curved cover plate. Alternatively, one end of the support body 310 having a support surface can be received in the inner side of the irregular-shaped curved cover plate. Preferably, a shape of the support body 310 matches with a shape of the irregular-shaped curved cover plate 200. That is, the bottom of the support body 310 corresponds to the flat area 210 of the irregular-shaped curved cover plate 200, and the sides of both ends of the support body 310 correspond to the arc hook areas 220 of the irregular-shaped curved cover plate 200.

Preferably, a vacuum adsorption hole (not shown) is formed on a surface of the support body 310 for supporting the flexible screen 100, and the flexible screen 100 is adsorbed on the support surface of the support body 310. That is, the flexible screen 100 can be wrapped and adsorbed on the support body 310 by vacuum adsorption. Of course, the support body 310 is not limited thereto, and the flexible screen 100 may be attached to the support body 310 in other manners. For example, both ends of the flexible screen 100 may also be pulled to attach it to the bonding body 320.

The bonding body 320 is used to support the flexible screen 100 together with the support body 310 and to press the flexible screen 100. The bonding body 320 has a cylindrical shape, and two ends of the bonding body 320 respectively correspond to the arc hook areas 220 of the irregular-shaped curved cover plate 200. A cross-sectional shape of the bonding body 320 along an axial direction matches with a cross-sectional shape of the irregular-shaped curved cover plate 200. The support body 310 is located at a radial end of the bonding body 320.

The bonding body 320 supports the flexible screen 100, together with the support body 310, which means the support body 310 is immediately adjacent to the radial end of the bonding body 320, the flexible screen 100 is wrapped on both axial sides of the bonding body 320 and an outer side of the support body 310 before bonding.

The bonding body 320 can be expanded along the axial direction, to have the opposite sides thereof abutted against the arc hook areas 220. When the support body 310 moves along the radial direction of the bonding body 320, the bonding body 320 is driven to move to press the flexible screen 100. The movement of the bonding body 320 may be translation or scrolling.

Figure 3:
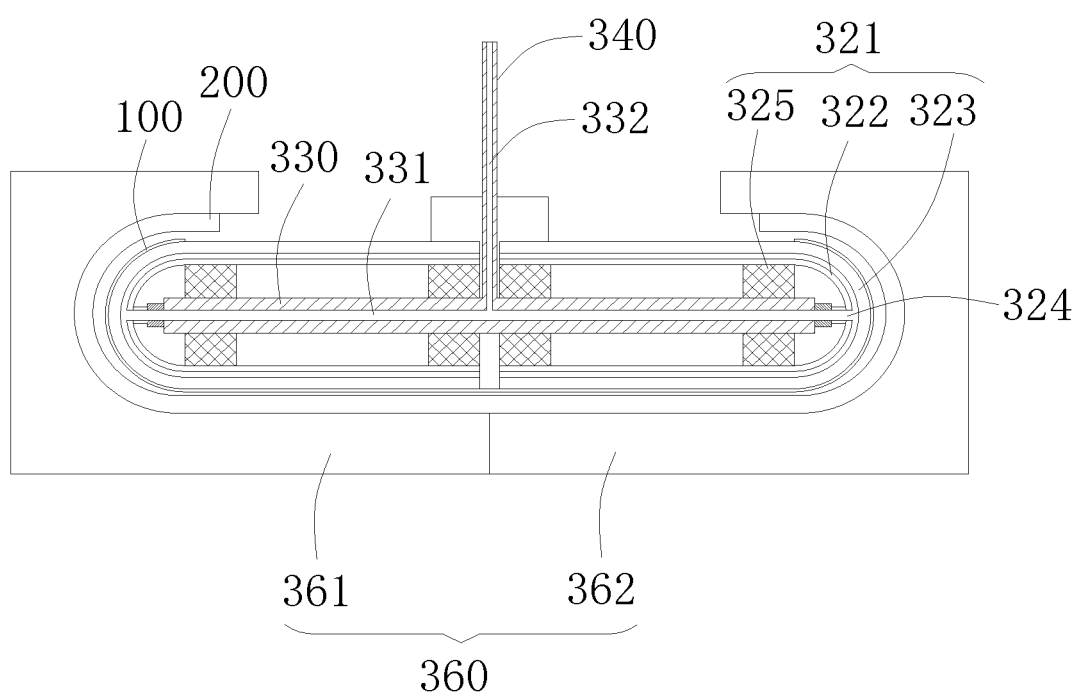
FIG. 3 is a schematic view showing a position of a bonding device, an irregular-shaped curved cover plate, and a flexible screen according to an embodiment of the present disclosure.

Based on the foregoing embodiments, referring to FIG. 3 together, the bonding body 320 includes two bonding half cylinders 321 disposed axially symmetrically. Each of the bonding half cylinders 321 includes a skeleton layer 322 and an elastic pressing layer 323 wrapped outside the skeleton layer 322. The skeleton layer 322 and the elastic pressing layer 323 has an inflatable gas film cavity 324 formed therebetween.

The two bonding half cylinders 321 are bonded to both sides of the flexible screen 100, respectively. The skeleton layer 322 supports the outer elastic pressure layer 323. The material of the skeleton layer 322 is not limited hereto, and any material having a certain strength and capable of supporting may be used.

Based on the foregoing embodiments, the elastic pressure layer 323 is a silica gel layer. The silica gel has a good sealing performance and toughness as the elastic pressing layer 323. After inflating the gas film cavity 324, the silica gel layer can be sufficiently pressed against the flexible screen 100 after the expansion of the silica gel layer, thereby avoiding the presence of bubbles between the flexible screen 100 and the irregular-shaped curved cover plate 200. The material of the elastic pressure layer 323 is not limited thereto, and may be other materials that can be expanded, for example, Teflon or the like.

Based on the foregoing embodiments, referring to FIG. 3, the bonding device 300 further includes a connecting rod 330 and a driving rod 340.

The connecting rod 330 extends through an interior of the two bonding half cylinders 321 along the axial direction, and has a first air passage 331 in communication with the gas film cavity 324 in an interior thereof.

The driving rod 340 is vertically connected to the connecting rod 330, and has a second air passage 332 in communication with the first air passage 331 in an interior of the driving rod 340. The driving rod 340 is vertically connected to the connecting rod 330, it means the axial direction of the driving rod 340 is perpendicular to the axial direction of the connecting rod 330.

When inflated into the gas film cavity 324, the gas may sequentially pass through the second air passage 332, the first air passage 331, and then enter the gas film cavity 324.

Preferably, the driving rod 340 is located between the two bonding half cylinders 321. During the flow of the gas from the second air passage 332 to the first air passage 331, the gas may flow into the first air passage 331 in two ways at a position where the driving rod 340 is vertically connected to the connecting rod 330, which is advantageous for improving the efficiency of the inflation.

Based on the foregoing embodiments, the bonding device 300 further includes a gas source 350 inflating the gas film cavity 324 of the bonding body 320, and the gas source 350 is connected to the driving rod 340. When the gas source 350 is used to inflate the gas film cavity 324, the gas may sequentially pass through the second air passage 332, the first air passage 331, and then enter the gas film cavity 324.

Preferably, the gas source 350 is a telescopic cylinder. Preferably, referring to FIG. 2, the telescopic cylinder is fixed to a top of one end of the support body 310 adjacent to the bonding body 320. When the support body 310 moves, the telescopic cylinder can be driven to move, thereby driving the driving rod 340 to move, such that the bonding body 320 is driven to move to press the flexible screen 100. Such configuration is simple to operate, and only the support body 310 is required to be moved during pressing.

Based on the foregoing embodiments, referring to FIG. 3, the bonding half cylinder 321 further includes a bonding half cylinder bearing 325 located in the skeleton layer 322. The bonding half cylinder bearing 325 is sleeved on an outer side of the connecting rod and abuts against an inner wall of the skeleton layer 322. Each of the bonding half cylinders 321 includes two bonding half cylinder bearings 325, and the two bonding half cylinder bearings 325 are respectively located at both ends of the interior of the bonding half cylinder 321, so as to provide better support for the skeleton layer 322.

Based on the foregoing embodiments, the bonding device 300 further includes a driving device (not shown). The driving device is connected to the support body 310 and is used to drive the support body 310 to move along a direction perpendicular to the axial direction of the bonding body 320.

Based on the foregoing embodiments, the bonding device 300 further includes a cover plate positioning fixture 360 positioning the irregular-shaped curved cover plate 200. An arc surface is formed on an inner surface of the cover plate positioning fixture 360, and the curvature of the arc surface coincides with the curvature of the irregular-shaped curved cover plate 200.

Preferably, the cover plate positioning fixture 360 includes a first sub-positioning fixture 361 and a second sub-positioning fixture 362 aligned with each other. When the cover plate positioning fixture 360 is used, one side of the irregular-shaped curved cover plate 200 may be first inserted from one side of the first sub-positioning fixture 361, and then the second sub-positioning fixture 361 is aligned with the first sub-positioning fixture 361. A size of an inner wall of the cover plate positioning fixture 360 after aligning is the same as a size of the irregular-shaped curved cover plate 200. Since the cover plate positioning fixture 360 can be disassemble into two sub-positioning fixtures, the installation of the irregular-shaped curved cover plate 200 can be facilitated. After the bonding of the irregular-shaped curved cover plate 200 and the flexible screen 100 is completed, the irregular-shaped curved cover plate 200 and the flexible screen 100 can be removed by simply disassembling the two sub-positioning fixtures.

In the aforementioned bonding device, the bonding body supports the flexible screen, together with the support body, and after the bonding body expands along an axial direction, opposite sides of the bonding body can abut against the arc hook areas to complete the end bonding. Afterwards, when the support body moves along the radial direction of the bonding body, the bonding body is driven to move to press the flexible screen, thereby further improving the bonding effect.

Figure 4:
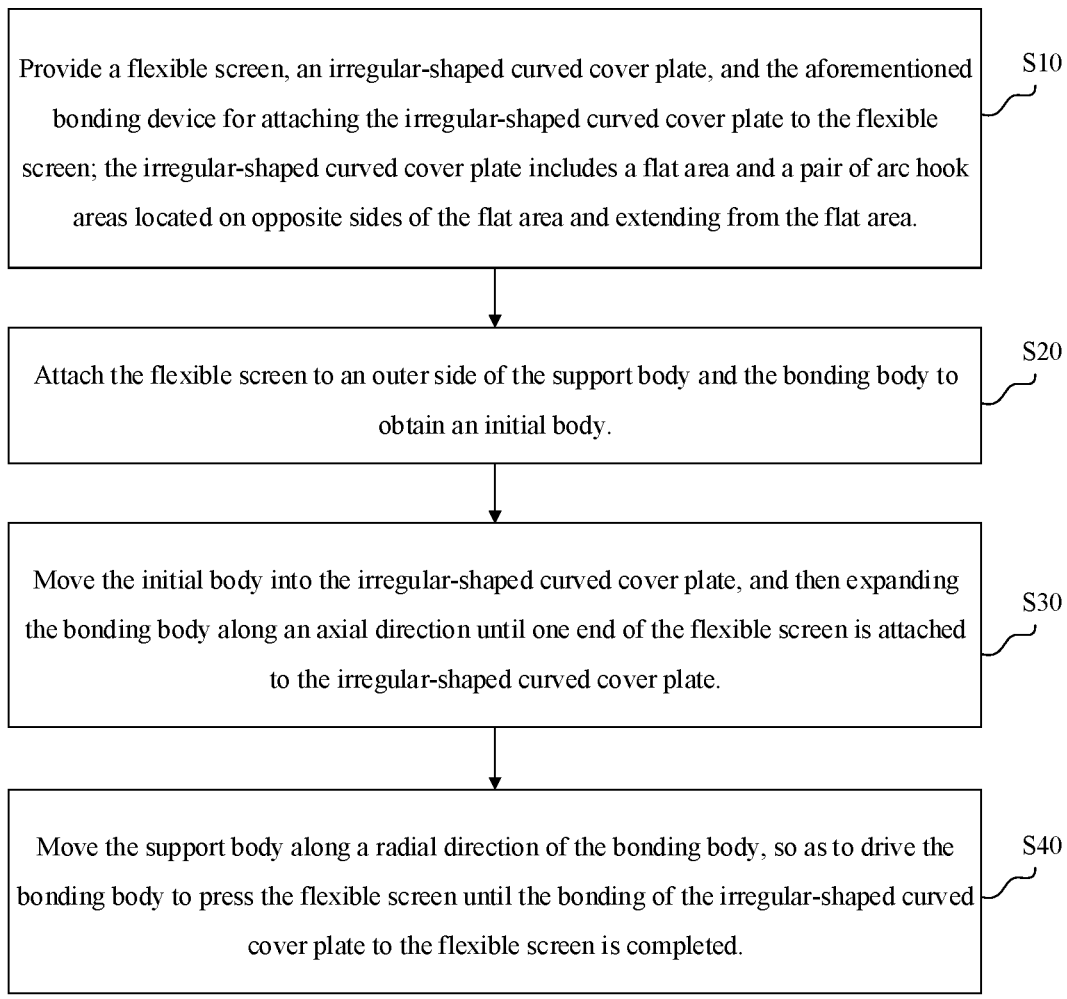
FIG. 4 is a flow chart of a method of bonding an irregular-shaped curved cover plate to a flexible screen according to an embodiment of the present disclosure.

Referring to FIG. 4, a method of bonding an irregular-shaped curved cover plate to a flexible screen according to an embodiment is shown, which includes the following steps:

In step S10, referring to FIG. 1 to FIG. 2, a flexible screen 100, an irregular-shaped curved cover plate 200, and the aforementioned bonding device 300 for attaching the irregular-shaped curved cover plate to the flexible screen are provided. The irregular-shaped curved cover plate 200 includes a flat area 210 and a pair of arc hook areas 220 located on opposite sides of the flat area 210 and extending from the flat area 210.

Referring to FIG. 2, a bonding device 300 according to an embodiment of the present disclosure is shown, which includes a support body 310 and a bonding body 320. The support body 310 is used to support the flexible screen 100, and a shape of the support body 310 matches with a shape of the irregular-shaped curved cover plate 200.

The bonding body 320 is used to support the flexible screen 100, together with the support body 310, and to press the flexible screen 100. The bonding body 320 has a cylindrical shape, and a cross-sectional shape of the bonding body 320 along an axial direction matches with a cross-sectional shape of the irregular-shaped curved cover plate 200. The support body 310 is located at a radial end of the bonding body 320.

The bonding body 320 can be expanded along the axial direction, to have the opposite sides thereof abutted against the arc hook areas 220. When the support body 310 moves along the radial direction of the bonding body 320, the bonding body 320 is driven to move to press the flexible screen 100.

Figure 5:
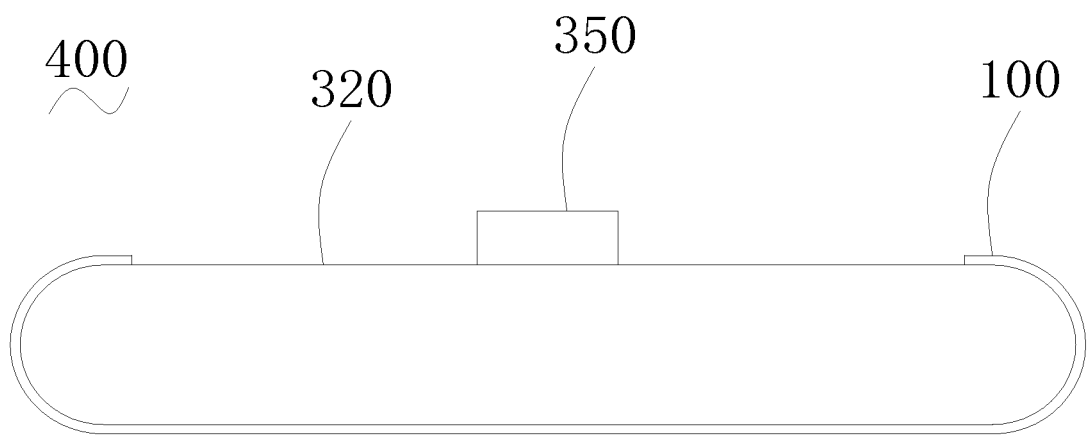
FIG. 5 is a schematic view of an initial body according to an embodiment of the present disclosure.

In step S20, referring to FIG. 5, the flexible screen 100 is attached to an outer side of the support body 310 and the bonding body 320 to obtain an initial body 400.

Specifically, when the flexible screen 100 is attached, the support body 310 is immediately adjacent to the bonding body 320, and then the flexible screen 100 is wrapped on both axial sides of the bonding body 320 and an outer side of the support body 310 to obtain the initial body 400.

Preferably, the surface of the support body 310 is preferably designed for vacuum adsorption. That is, most of the flexible screen 100 can be wrapped and adsorbed on the outer side of the support body 310 by vacuum adsorption. In addition, the remaining small portion of the flexible screen 100 is wrapped on the outer side of the bonding body 320. It should be noted that the degree of vacuum during vacuum adsorption can be set according to actual conditions.

Figure 6:
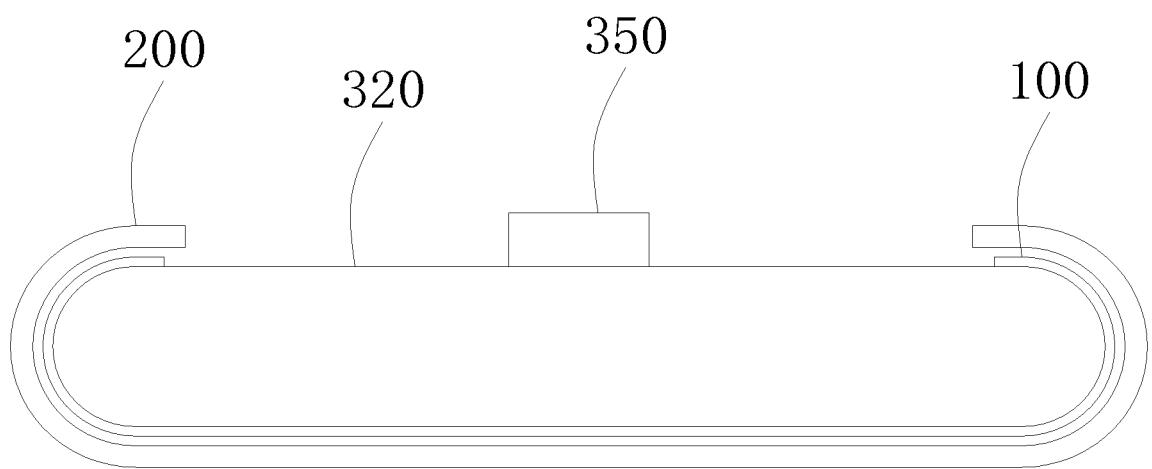
FIG. 6 is a schematic view showing a position of an irregular-shaped curved cover plate and a flexible screen before an expansion of a bonding body according to an embodiment of the present disclosure.

In step S30, referring to FIG. 6, the initial body 400 is translated from one end of the irregular-shaped curved cover plate 200 into the irregular-shaped curved cover plate 200. And then, referring to FIG. 7, the bonding body 320 is expanded along an axial direction until one end of the flexible screen 100 is attached to the irregular-shaped curved cover plate 200.

Referring to FIG. 6, when the initial body 400 is translated from the end of the irregular-shaped curved cover plate 200 into the irregular-shaped curved cover plate 200, the size of the initial body 400 is less than a cavity size inside the irregular-shaped curved cover plate 200. Therefore, during the translation process, the initial body 400 and the inner wall of the irregular-shaped curved cover plate 200 are always kept at a certain distance, so that both ends of the flexible screen 100 can be prevented from interfering with both ends of the irregular-shaped curved cover plate 200.

In the present embodiment, the distance between the initial body 400 and the inner wall of the irregular-shaped curved cover plate 200 is small, so that the flexible screen 100 can be effectively pressed.

Preferably, referring to FIG. 3 together, the bonding body 320 includes two bonding half cylinders 321 disposed axially symmetrically. Each of the bonding half cylinders 321 includes a skeleton layer 322 and an elastic pressing layer 323 wrapped outside the skeleton layer 322. The skeleton layer 322 and the elastic pressing layer 323 has an inflatable gas film cavity 324 formed therebetween.

The operation of expanding the bonding body 320 along the axial direction is: the gas film cavity 324 is filled with gas to expand the bonding half cylinder along the axial direction.

More preferably, referring to FIG. 3, the bonding device 300 further includes a connecting rod 330 and a driving rod 340.

The connecting rod 330 extends through an interior of the two bonding half cylinders 321 along the axial direction, and has a first air passage 331 in communication with the gas film cavity 324 in an interior thereof.

The driving rod 340 is vertically connected to the connecting rod 330. The driving rod 340 is located between the two bonding half cylinders 321, and the interior of the driving rod 340 has a second air passage 332 in communication with the first air passage 331.

More preferably, the bonding device 300 further includes a gas source 350 inflating the gas film cavity 324 of the bonding body 320, and the gas source 350 is connected to the driving rod 340.

More preferably, referring to FIG. 2, the gas source 350 is a telescopic cylinder. The telescopic cylinder is fixed to a top of one end of the support body 310 adjacent to the bonding body 320.

After the initial body 400 is translated from the end of the irregular-shaped curved cover plate 200 into the irregular-shaped curved cover plate 200, the telescopic cylinder is extended, the bonding body 320 is moved downwardly while the telescopic cylinder is used to fill the bonding body 320 with gas, until one end of the flexible screen 100 is attached to the irregular-shaped curved cover plate 200. When inflated into the gas film cavity 324, the gas may sequentially pass through the second air passage 332, the first air passage 331, and then enter the gas film cavity 324.

Figure 7:
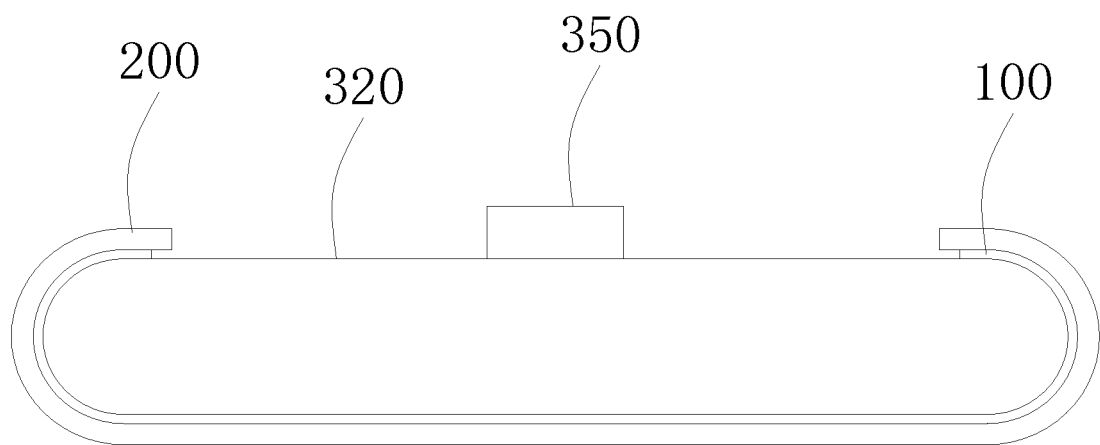
FIG. 7 is a schematic view showing a position of an irregular-shaped curved cover plate and a flexible screen after an expansion of a bonding body according to an embodiment of the present disclosure.

Specifically, referring to FIG. 7, after the bonding body 320 is expanded along the axial direction, the flexible screen 100 is attached to the inner wall of the irregular-shaped curved cover plate 200 by the volume-increasing bonding body 320. Specifically, the corresponding area of the flexible screen 100 is attached to the flat area 210 and the arc hook areas 220 of the irregular-shaped curved cover plate 200.

During this process, the adsorption force of the support body 310 on the flexible screen 100 can be gradually reduced, so that the support body 310 is gradually separated from the flexible screen 100, thereby preventing the flexible screen 100 from being damaged due to excessive adsorption force.

In step S40, the support body 310 is then moved along a radial direction of the bonding body 320, so as to drive the bonding body 320 to press the flexible screen 100 until the bonding of the irregular-shaped curved cover plate 200 and the flexible screen 100 is completed.

Figure 8:
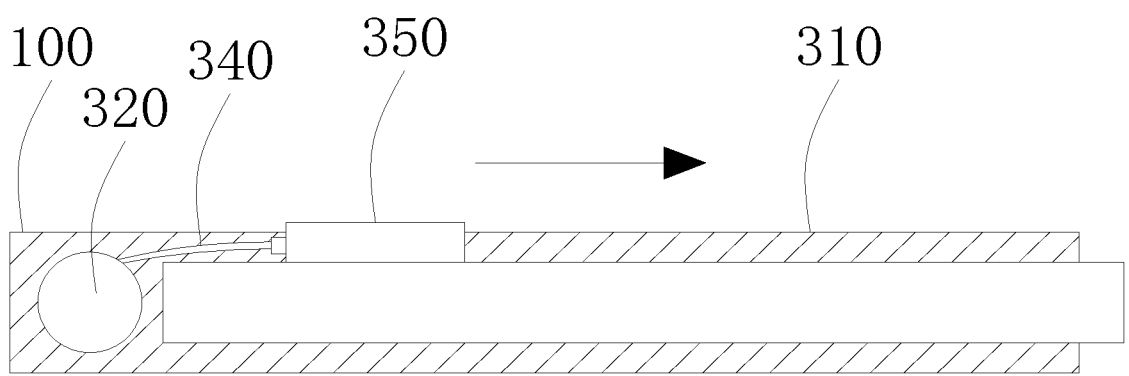
FIG. 8 is a schematic view showing a first position of a bonding device in a process of bonding an irregular-shaped curved cover plate to a flexible screen according to an embodiment of the present disclosure.
Figure 9:
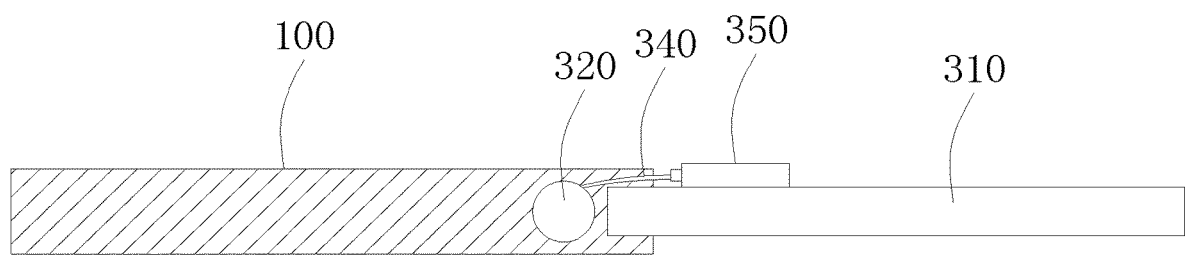
FIG. 9 is a schematic view showing a second position of a bonding device in a process of bonding an irregular-shaped curved cover plate to a flexible screen according to an embodiment of the present disclosure.

Referring to FIG. 8 and FIG. 9, the bonding device 300 is moved from a first direction to a second direction along a direction indicated by an arrow in FIG. 8, and then the bonding device 300 continues to move to the right until the bonding of the irregular-shaped curved cover plate 200 and the flexible screen 100 is completed.

In the aforementioned method of bonding the irregular-shaped curved cover plate to the flexible screen, both ends of the flexible screen are prevented from interfering with both ends of the irregular-shaped curved cover plate by entering from the end of the irregular-shaped curved cover plate. In addition, after the bonding body expands along the axial direction, opposite sides of the bonding body can abut against the arc hook areas to complete the end bonding. Afterwards, when the support body moves along the radial direction of the bonding body, the bonding body is driven to move to press the flexible screen, thereby further improving the bonding effect.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention. Therefore, the protection scope of the present invention shall be subject to the protection scope of the appended claims.

The invention claimed is:

1. A bonding device, adapted for attaching an irregular-shaped curved cover plate to a flexible screen, wherein the irregular-shaped curved cover plate comprises a flat area and a pair of arc hook areas located on opposite sides of the flat area and extending from the flat area, the bonding device comprising:
   a support body configured for supporting the flexible screen; and
   a bonding body configured for supporting the flexible screen together with the support body, and configured for pressing the flexible screen onto the irregular-shaped cover plate including the arc hook areas, the bonding body having a cylindrical shape extending in an axial direction and including two ends, the two ends of the bonding body respectively corresponding to the arc hook areas of the irregular-shaped curved cover plate, a cross-sectional shape of the bonding body along the axial direction matching with a cross-sectional shape of the irregular-shaped curved cover plate, the support body being located at a radial end of the bonding body, the bonding body being capable of expanding along the axial direction, to have opposite sides thereof abutted against the arc hook areas.

2. The bonding device according to claim 1, wherein the bonding body comprises two bonding half cylinders disposed axially symmetrically, each of the bonding half cylinders comprising a skeleton layer, and an elastic pressing layer wrapped outside the skeleton layer, and the skeleton layer and the elastic pressing layer comprising an inflatable gas film cavity formed therebetween.

3. The bonding device according to claim 2 further comprising:
   a connecting rod extending through an interior of the two bonding half cylinders along the axial direction, an interior of the connecting rod having a first air passage in communication with the gas film cavity; and
   a driving rod vertically connected to the connecting rod, an interior of the driving rod having a second air passage in communication with the first air passage.

4. The bonding device according to claim 3 further comprising a gas source inflating the gas film cavity of the bonding body, the gas source being connected to the driving rod.

5. The bonding device according to claim 4, wherein the gas source is a telescopic cylinder.

6. The bonding device according to claim 5, wherein the telescopic cylinder is fixed to a top of one end of the support body adjacent to the bonding body.

7. The bonding device according to claim 3, wherein each bonding half cylinder further comprises a bonding half cylinder bearing located in the skeleton layer, the bonding half cylinder bearing is sleeved on an outer side of the connecting rod and abuts against an inner wall of the skeleton layer.

8. The bonding device according to claim 3 further comprising a driving device connected to the support body and driving the support body to move along a direction perpendicular to the axial direction of the bonding body.

9. The bonding device according to claim 2, wherein the elastic pressing layer is a silica gel layer.

10. The bonding device according to claim 1, further comprising a cover plate positioning fixture for positioning the irregular-shaped curved cover plate.

* * * * *